United States Patent [19]

Hagimori et al.

[11] Patent Number: 5,537,614
[45] Date of Patent: Jul. 16, 1996

[54] SIGNAL LEVEL DISPLAY UNIT

[75] Inventors: Haruo Hagimori; Shuji Ohnishi, both of Kyoto, Japan

[73] Assignee: Rohm Co., Ltd., Kyoto, Japan

[21] Appl. No.: 407,796

[22] Filed: Mar. 20, 1995

Related U.S. Application Data

[63] Continuation of Ser. No. 905,837, Jun. 29, 1992, abandoned.

[30] Foreign Application Priority Data

Jul. 1, 1991 [JP] Japan ..................... 3-160356

[51] Int. Cl.$^6$ ................................. H04R 29/00
[52] U.S. Cl. ............................. 381/58; 381/103
[58] Field of Search ..................... 381/56, 58, 119, 381/103, 109; 340/815.11, 815.03, 754, 753; 345/35, 40; 455/157.2

[56] References Cited

U.S. PATENT DOCUMENTS

| | | | |
|---|---|---|---|
| 4,183,025 | 1/1980 | Kutaraji et al. | 340/753 |
| 4,307,340 | 12/1981 | Inami et al. | 381/58 |
| 4,412,349 | 10/1983 | Wright | 345/150 |
| 4,532,472 | 7/1985 | Ishino . | |
| 4,577,188 | 3/1986 | Inami et al. . | |
| 4,665,494 | 5/1987 | Tanaka et al. . | |
| 4,947,133 | 8/1990 | Thomas | 381/106 |

FOREIGN PATENT DOCUMENTS

| | | |
|---|---|---|
| 2914840 | 8/1980 | Germany . |
| 2174829 | 1/1986 | United Kingdom . |

*Primary Examiner*—Forester W. Isen
*Assistant Examiner*—Ping W. Lee
*Attorney, Agent, or Firm*—Wolf, Greenfield & Sacks

[57] ABSTRACT

A signal level display unit which makes adjustment for correcting of deviation unnecessary and enables cost reduction. An input analog audio signal 26 is divided into seven signals having different frequency bands, converted into digital signal by an A/D converter 22, input to a display controller 25, and temporarily stored in a storage unit 32. A preset recovery time which is input to the display controller 25 through an A/D converter 28 is also stored in the storage unit 32. The value of each signal newly input from the A/D converter 22 is compared with the current value stored in the storage unit 32. When the value of a newly input signal is higher than the current value, the value displayed by a liquid crystal indicator 23 is immediately renewed. On the other hand, when no signal having a higher value than the current value is input, the displayed value is renewed after the preset recovery time stored in the storage init 32 has elapsed.

4 Claims, 5 Drawing Sheets

FIG. 2

| A/D CONVERTED VALUE | | | COUNT VALUE | RECOVERY TIME (msec) |
|---|---|---|---|---|
| MSB | LSB | (DEC) | | |
| 1111 | xxxx xxxx | ≥240 | 40 | 2000 |
| 1110 | xxxx xxxx | ≥224 | 37 | 1850 |
| 1101 | xxxx xxxx | ≥208 | 35 | 1750 |
| 1100 | xxxx xxxx | ≥192 | 32 | 1600 |
| 1011 | xxxx xxxx | ≥176 | 30 | 1500 |
| 1010 | xxxx xxxx | ≥160 | 28 | 1400 |
| 1001 | xxxx xxxx | ≥144 | 25 | 1250 |
| 1000 | xxxx xxxx | ≥128 | 22 | 1100 |
| 0111 | xxxx xxxx | ≥112 | 20 | 1000 |
| 0110 | xxxx xxxx | ≥96 | 18 | 900 |
| 0101 | xxxx xxxx | ≥80 | 15 | 750 |
| 0100 | xxxx xxxx | ≥64 | 13 | 650 |
| 0011 | xxxx xxxx | ≥48 | 10 | 500 |
| 0010 | xxxx xxxx | ≥32 | 8 | 400 |
| 0001 | xxxx xxxx | ≥16 | 5 | 250 |
| 0000 | xxxx xxxx | ≥0 | 2 | 100 |

FIG. 3

| A/D CONVERTED VALUE | | | OUTPUT VOLTAGE | |
|---|---|---|---|---|
| MSB | LSB | (DEC) | (dB) | (V) |
| 1111 | 1111 | 255 | 10 | 4.98 |
| 1001 | 1001 | 153 | 6 | 2.99 |
| 0110 | 1100 | 108 | 3 | 2.11 |
| 0100 | 1101 | 77 | 0 | 1.50 |
| 0011 | 0110 | 54 | -3 | 1.06 |
| 0010 | 0110 | 38 | -6 | 0.75 |
| 0001 | 1000 | 24 | -10 | 0.47 |
| 0000 | 1000 | 8 | -20 | 0.15 |

SIGNAL LEVEL DISPLAY UNIT

This application is a continuation of application Ser. No. 07/905,837, filed Jun. 29, 1992, now abandoned.

BACKGROUND OF THE INVENTION

1. Field of the Invention

The present invention relates to a display unit such as a level indicator for audio apparatuses.

2. Description of the Related Art

Most audio apparatuses such as a CD or a DAT and most video apparatuses such as a television set or a VTR are equipped with an indicator for indicating the level of an input signal. Such an indicator is composed of an element such as a light emitting diode array or a liquid crystal indicator, and changes the number of displayed segments in accordance with the input level.

FIG. 5 shows an example of such an indicator. The indicator is provided with liquid crystal indicators 11-1 to 11-7, each of which is composed of a plurality of liquid crystal segments. The liquid crystal indicators 11-1 to 11-6 indicate the level of input signals in six frequency bands, and the liquid crystal indicator 11-7 indicates the average input level.

In this type of indicator, when a signal of a higher level than the current level is input, all the segment lamps below this level are immediately lit in correspondence with the input level, but when no signal of a higher level than the current level is input within a predetermined time, the segment lamps are sequentially turned off every predetermined time period so as to gradually lower the displayed level. This is called recovery control, which is carried out because if the level is lowered immediately after a signal is input, the eyes of the user cannot follow the change and cannot recognize the preceding displayed level.

Such a display including recovery control is applied to not only audio apparatuses but also various other apparatuses including electronic measuring instruments and the display panel of an automobile for displaying the number of revolutions of the engine, the vehicle's speed, etc. The recovery time is conventionally controlled by fixed hardware. In other words, a filter composed of a resistor R and a capacitor C is externally attached to an integrated circuit chip for controlling a liquid crystal indicator, and the recovery time is set by approximately selecting the values of the capacitor C and the resistor R.

Since the recovery time for the display is set by the filter composed of the capacitor C and the resistor R in a conventional level indicator, as described above, for example, the level indicator for seven frequency bands shown in FIG. 5 requires more than 20 parts. That is, the number of parts for external attachment is inconveniently very large. Especially, in the case of setting a long recovery time, the value of the capacitor C must be set at a large value, which leads to an increase in cost. If the values of the parts such as the capacitor C and the resistor R are not uniform, the values of the products also become non-uniform, so that it is difficult to set the recovery time of a product at the target value. If the deviation from the target value is too large, the adjusting process for correcting the deviation is necessary, which further increases the cost.

In addition, in the case of changing the recovery time due to a change in the specification of a product, it is necessary to change the value of each part to an appropriate value in correspondence with the changed recovery time, thereby requiring a lot of labor in manufacturing the product.

SUMMARY OF THE INVENTION

Accordingly, it is an object of the present invention to eliminate the above-described problems in the related art and to provide a display unit which requires no adjustment for correcting a deviation and which can flexibly respond to a change in the specification.

To achieve this aim, in a first aspect of the present invention, there is provided a display unit comprising: a) an indicator for displaying the level corresponding to the level of an input signal; b) a recovery time memory means for storing a preset recovery time; c) a peak value holding means for holding the peak value of the levels of the signals input within a predetermined period; d) a current value holding means for holding the level of a newly input signal; e) a comparing means for comparing the value stored in the peak value holding means with the value stored in the current value holding means; and f) a display control means for immediately changing the level displayed by the indicator to the level corresponding to the level of the newly input signal when the result of the comparison shows that the level of the newly input signal stored in the current value holding means exceeds the peak value stored in the peak value holding means, while renewing the level displayed by the indicator after the elapse of the recovery time preset in the recovery time memory means when the result of the comparison shows that the level of the newly input signal is not higher than the peak value.

According to this structure, when the level of a newly input signal is lower than the current displayed value, the current displayed level is held until the recovery time has elapsed so as to delay the renewal of the displayed level.

Since it is possible to set the recovery time as desired, the degree of freedom of setting is increased and it is very easy to set or change the recovery time.

In a second aspect of the present invention, there is provided a display unit similar to that provided in the first aspect of the present invention, wherein the display control means includes a counter which is reset to the recovery count value corresponding to the recovery time which is preset in the recovery time memory means. Display control means immediately changes the level displayed by the indicator to the level corresponding to the level of the newly input signal and decrements the counter after resetting the counter when the level of the newly input signal exceeds the peak value, while it only decrements the counter and does not renew the level displayed by the indicator until the counter indicates "0" when the level of the newly input signal is not higher than the peak value.

In a third aspect of the present invention, there is provided a display unit similar to that provided in the first aspect of the present invention, wherein the display control means is a microcomputer.

In a fourth aspect of the present invention, there is provided a display unit similar to that provided in the first aspect of the present invention, wherein a random access memory is used as the recovery time memory means, the peak value holding means and the current value holding means.

In a fifth aspect of the present invention, there is provided a display unit similar to that provided in the first aspect of the present invention, wherein an analog audio signal is input as the input signal and converted to a digital value before the subsequent processing stages.

In a sixth aspect of the present invention, there is provided a display unit comprising: a) an indicator for displaying the level corresponding to the level of an input signal in each frequency band; b) a recovery time memory means for storing a preset recovery time; c) a bandpass filter for classifying an input signal into signals in a predetermined number of frequency bands; d) a peak value holding means for holding the peak value of the levels of the signals input within a predetermined period in each frequency band classified by said bandpass filter; e) a current value holding means for holding the level of a newly input signal in each frequency band; f) a comparing means for comparing the value stored in the peak value holding means with the value stored in the current value holding means in each frequency band; and g) a display control means for immediately changing the level in the corresponding frequency band displayed by the indicator to the level corresponding to the level of the newly input signal when the result of the comparison shows that the level of the newly input signal stored in the current value holding means exceeds the peak level stored in the peak value holding means, while renewing the level in the corresponding frequency band displayed by the indicator after the elapse of the recovery time which is preset in the recovery time memory means when the result of the comparison shows that the level of the newly input signal is not higher than the peak level.

This display unit not only has the same effect on the setting of the recovery time as the display unit provided in the first aspect of the present invention, but also it can display the level of an input signal in each frequency band in an audio apparatus or the like.

In a seventh aspect of the present invention, there is provided a display unit similar to that provided in the sixth aspect of the present invention, wherein the indicator is a liquid crystal indicator.

In an eighth aspect of the present invention, there is provided a display unit similar to that provided in the seventh aspect of the present invention, wherein the liquid crystal indicator has an indicator portion for each frequency band which is composed of a plurality of liquid crystal segments, each indicator portion displaying the liquid crystal segments the number of which corresponds to the level of the input signal in the corresponding frequency band.

The above and other objects, features and advantages of the present invention will become clear from the following description of the preferred embodiment thereof, taken in conjunction with the accompanying drawings.

BRIEF DESCRIPTION OF THE DRAWINGS

FIG. 2 is a table showing the corresponding relationship between the preset recovery time stored in the memory portion and the recovery count value in the embodiment;

FIG. 3 is a table showing the corresponding relationship between the input signal stored in the memory portion and the displayed output in the embodiment;

DESCRIPTION OF THE PREFERRED EMBODIMENT

The present invention will be explained in more detail with reference to a preferred embodiment.

Figure 1:
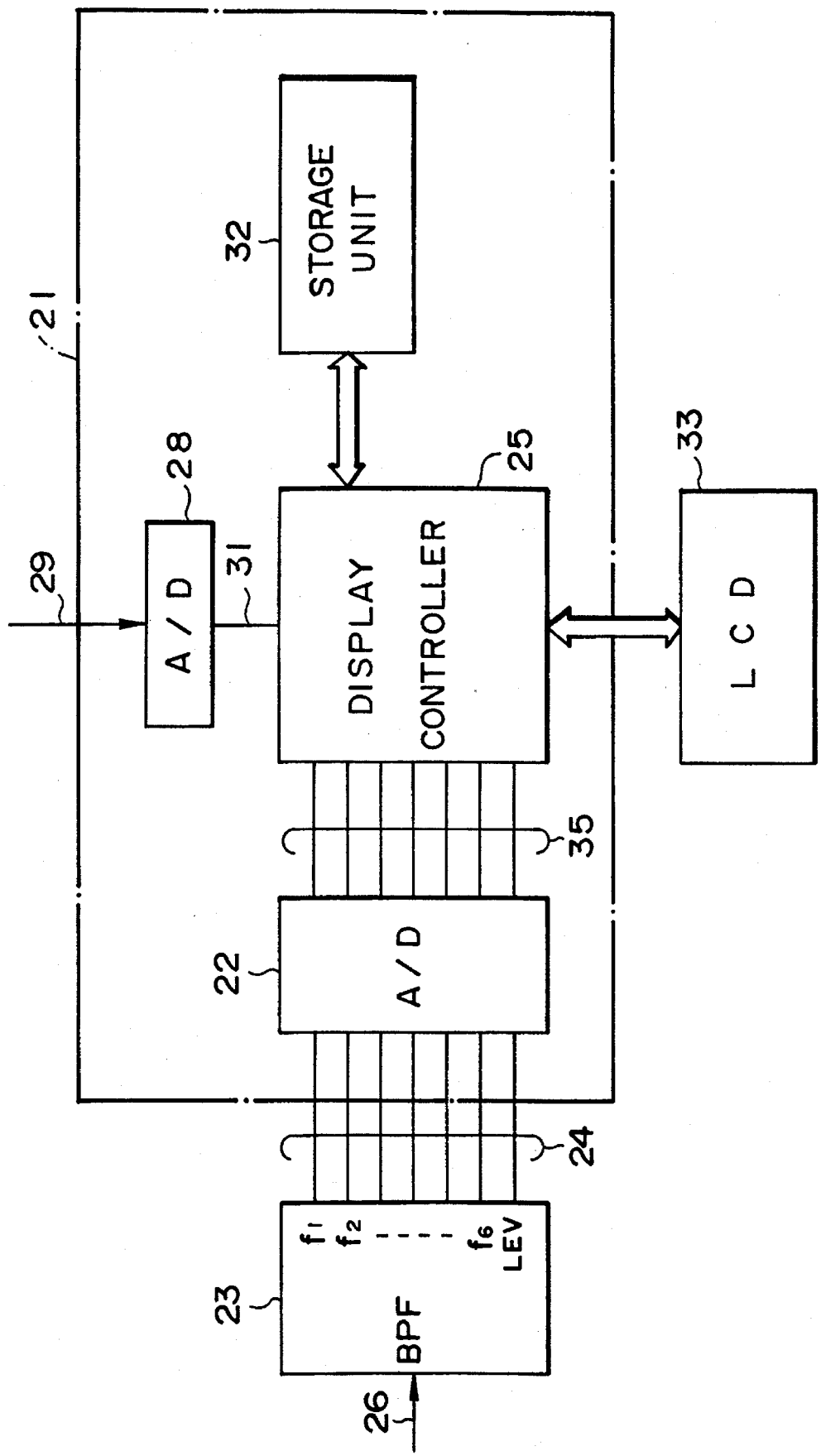
FIG. 1 is a block diagram of an embodiment of a display unit according to the present invention.

FIG. 1 is an embodiment of a display unit according to the present invention. A level display unit 21 is provided with an analog/digital (A/D) converter 22 and seven analog signals 24 which are input from a bandpass filter (BPF) 23 are converted into digital signals and input to a display controller 25. The bandpass filter 23 extracts six frequency components f1 to f6 and the average level LEV thereof from an analog audio signal 26 input to the bandpass filter 23, and outputs the seven analog signals 24.

The display controller 25 receives input from another A/D converter 28 which converts the preset recovery time 29 which is supplied from an input portion (not shown) into a digital value 31. The display controller 25 controls the display of a liquid crystal indicator 33 in correspondence with each of the seven digital signals supplied from the A/D converter 22. The level display unit 21 is provided with a storage unit 32 for storing the following data shown in (i) to (iii). The display controller 25 refers to the storage unit 32, if necessary.

(i) An 8-bit digital value 35 input from the A/D converter 22, i.e., the latest input value in each frequency band is stored.

(ii) A table (FIG. 2) of the digital value 31 indicating the preset recovery time and supplied from the A/D converter 28 and the recovery count value corresponding to the digital value 31 is stored. In this table, the recovery time is classified into 16 stages by the most significant 4 bits of the digital value 31, and the recovery count value is set in correspondence with each stage. In this embodiment, a time of 50 ms is allotted to each count value. In FIG. 2, the mark * shows any given value.

(iii) A table (FIG. 3) of the digital value 35 input from the A/D converter 22 and the voltage output to the liquid crystal indicator 33 is stored. In this table, the output voltages of 8 stages are set in correspondence with the input digital values.

Figure 4:
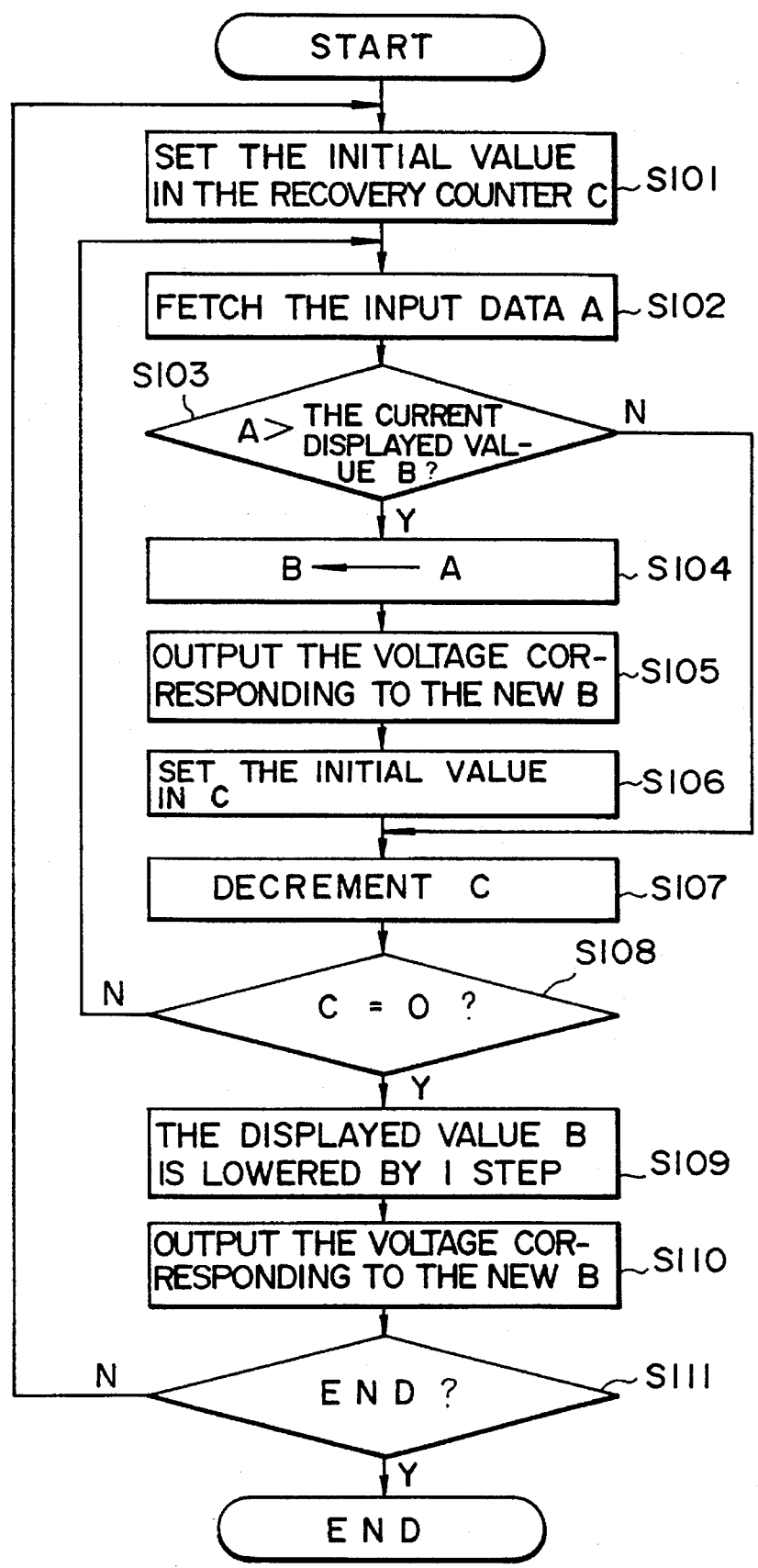
FIG. 4 is a flowchart for explaining the operation of the embodiment.
Figure 5:
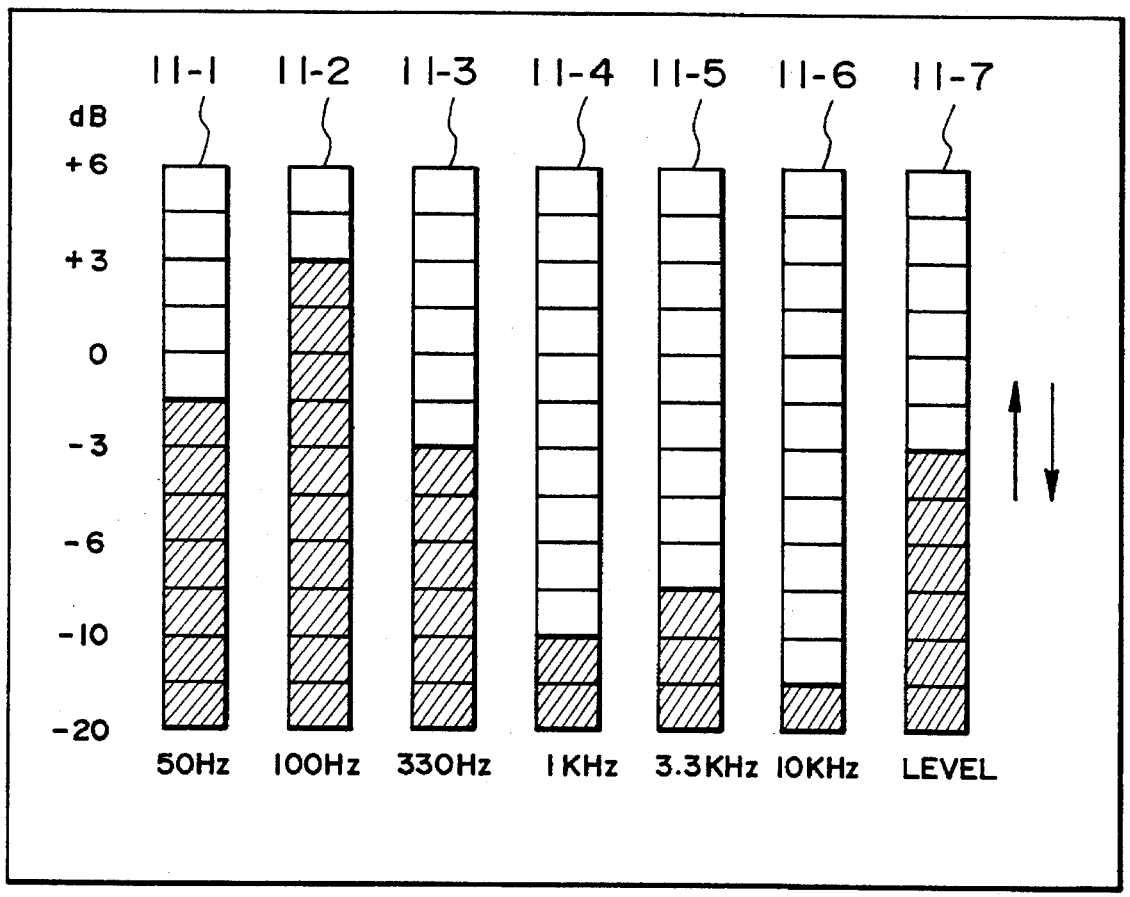
FIG. 5 is an explanatory view of an example of a level indicator.

The operation of the level display unit 21 having the above-described structure will be explained with reference to FIG. 4. When the preset recovery time 29 (FIG. 1) is input from the input portion for setting the recovery time, the preset recovery time 29 is converted into the digital value 31 of 8 bits by the A/D converter 28 and input to the display controller 25. The display controller 25 refers to the table (FIG. 2) of the storage unit 32 for this input value and reads out the corresponding recovery count value. For example, if the input digital value 31 is "00110000", i.e., 48 in decimal, the recovery count value is "10" and the recovery time is 500 ms in the table shown in FIG. 2.

The display controller 25 sets the recovery count value in a recovery counter C (not shown) as the initial value (step S101). The A/D converter 22 converts the analog signals 24 into the digital signals 35 and inputs them into the display controller 25 every 50 ms. The display controller 25 fetches the data and stores them in the storage unit 32 (step S102). Thereafter, the display controller 25 reads out the current value B displayed by the liquid crystal indicator 33 from the storage unit 32 and compares both data (step S103). If the value A of the newly input data is larger than the displayed value B (Y at step S103), the value B is replaced by the value A (step S104) as a newly displayed value B. The corresponding output voltage is extracted in reference to the table (FIG. 3) in the storage unit 32 and supplied to the liquid crystal indicator 33 (step S105). After the initial value is newly set in the recovery counter C (step S106), the value of the recovery counter C is decremented by 1(step S107).

On the other hand, if the newly input data A is smaller than the current displayed value B (N at step S103), the displayed value B is not renewed and only the recovery counter C is decremented by (step S107).

These operations at steps S102 to S107 are repeated until the value of the recovery counter C becomes "0". When the value of the recovery counter C becomes "0" (Y at step S108), the displayed value B is lowered by 1 stage (step S109), and the voltage corresponding to the newly obtained value is output to the liquid crystal indicator 33 (step S110). The initial value is set in the recovery counter C (step S101), and the operations at steps S101 to S110 are repeated until the instruction for the end of processing is issued (Y at step S111). These operations are executed for all the input signals having the frequency components f1 to f6 and the average level LEV.

If the recovery time is set at 500 ms as in this embodiment, when the level of the newly input signal is higher than the current displayed value, the displayed value is immediately renewed. On the other hand, if the level of the newly input signal is lower than the current displayed value, after the current displayed value is held for 500 ms, the displayed value is renewed. It is possible to use a microcomputer or hard logic as the display controller 25. It is also possible to use a DRAM or SRAM as the means for storing the recovery time and the input level. Alternatively, a register in the CPU may be used.

As described above, according to the present invention, it is possible to set a desired recovery time. When the newly input level is higher than the current displayed value, the displayed value is immediately renewed. On the other hand, when the newly input level is lower than the current displayed value, the renewal of the displayed value is delayed until the recovery time has elapsed. It is therefore easy to set or change the delay time for recovery as desired. It is also possible to provide display units which differ with users or which can display additional values other than what is called a peak-hold display.

In addition, since the externally attached filter part required in the related art is dispensed with, a reduction in cost is possible and it is possible to accurately set the recovery time at the target value, so that there is no non-uniformity in the recovery time among the products, thereby making adjustment to correct for deviation unnecessary.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. A display unit comprising:

means for converting an analog input audio signal to a digital signal having a signal level;

means for displaying signal levels;

means for receiving a recovery time signal indicating a recovery time;

first memory means for storing a presently displayed signal level;

second memory means for storing a presently input audio signal level;

comparison means for digitally comparing the signal levels stored in the first and second memory means and for providing a result of the comparison;

timer means for setting a recovery time based on the recovery time signal;

display renewal means for clearing the presently displayed signal level, for causing the presently received signal level to be displayed when the result from the comparison means indicates that the presently input signal level is higher than the presently displayed signal level, and for resetting the timer means;

means for maintaining the presently displayed audio signal level when the result from the comparison means indicates that the presently input signal level is equal to or less than the displayed signal level;

recovery display means for displaying a signal level while reducing the displayed signal level every time the timer means indicates that the recovery time has lapsed; and a digital controller for
   receiving an audio signal and the recovery time signal,
   storing the presently displayed audio signal level and the presently input audio signal level in the first and second memory means, respectively,
   comparing the stored signal levels by controlling the comparison means,
   digitally judging a level relation between the stored signal levels,
   driving the display renewal means, and
   carrying out a recovery display for the recovery time set by the timer means.

2. The unit of claim 1, wherein the timer means includes a counter.

3. The unit of claim 1, wherein the first and second memory means includes a RAM.

4. The unit of claim 1, further including a bandpass filter for filtering input audio signals and proving a plurality of outputs, wherein the bandpass filter is coupled to the means for converting to provide inputs to the means for converting.

* * * * *